United States Patent [19]

Pelc et al.

[11] Patent Number: 5,051,903
[45] Date of Patent: Sep. 24, 1991

[54] METHOD AND APPARATUS FOR PREDICTING VALUES OF A VARYING PERIODIC PHENOMENON

[75] Inventors: Norbert J. Pelc; Stephen W. Flax, both of Wauwatosa, Wis.

[73] Assignee: General Electric Company, Milwaukee, Wis.

[21] Appl. No.: 393,376

[22] Filed: Aug. 14, 1989

[51] Int. Cl.$^5$ .............................................. G06F 15/42
[52] U.S. Cl. .................. 364/413.13; 324/309
[58] Field of Search ..................... 364/413.13; 324/309

[56] References Cited

U.S. PATENT DOCUMENTS

| | | | |
|---|---|---|---|
| 4,567,610 | 1/1986 | McConnell | 382/18 |
| 4,580,219 | 4/1986 | Pelc et al. | 364/413.21 |
| 4,663,591 | 5/1987 | Pelc et al. | 324/309 |
| 4,706,026 | 9/1987 | Pelc et al. | 324/309 |
| 4,720,678 | 1/1988 | Glover et al. | 324/309 |
| 4,751,462 | 6/1988 | Glover et al. | 324/309 |
| 4,903,310 | 2/1990 | Takeo et al. | 364/413.13 X |

Primary Examiner—Jerry Smith
Assistant Examiner—Allen M. Lo
Attorney, Agent, or Firm—Quarles & Brady

[57] ABSTRACT

An apparatus for reducing image artifacts in NMR imaging matches elements of a set to values of a substantially periodic function so that the values exhibit a predetermined relationship to the elements. The matching is performed by evaluating the relative probability of the values of the substantially periodic function from the samples in the growing database of the values and assigning the values to the elements by using the evaluated relative probability, so as to maximize the probability that subsequent valves may be assigned the remaining elements according the predetermined relationship. A method for correcting the matching of values with elements freezes the database and acquires additional values which are substituted for earlier matched values based on the frozen database.

13 Claims, 6 Drawing Sheets

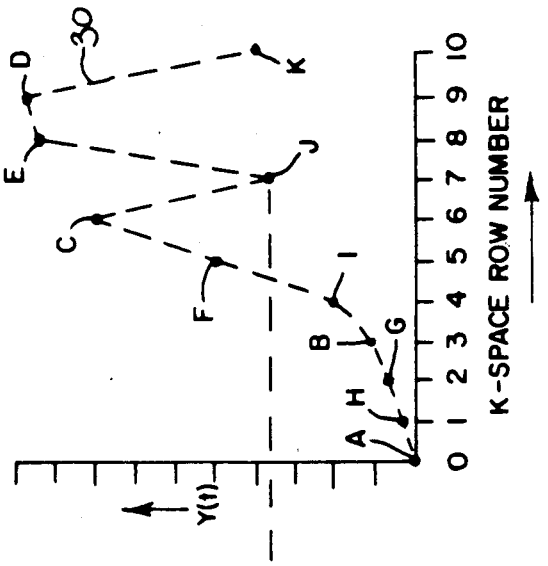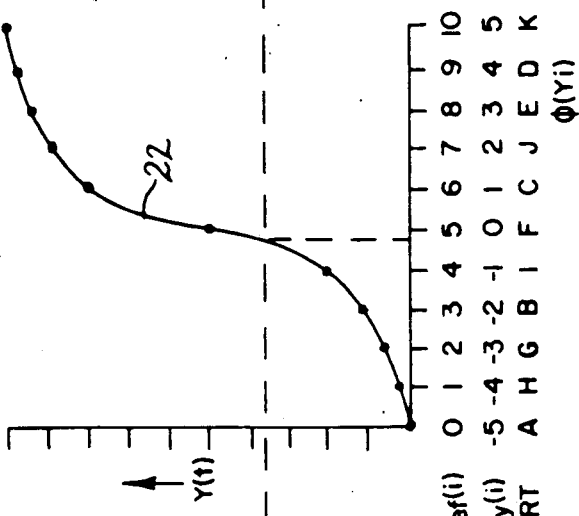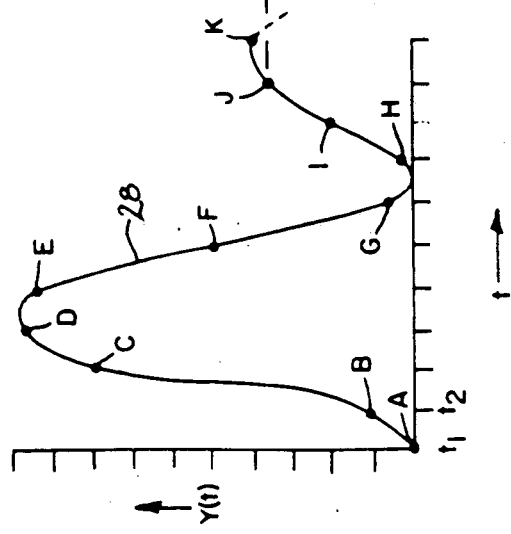

METHOD AND APPARATUS FOR PREDICTING VALUES OF A VARYING PERIODIC PHENOMENON

BACKGROUND OF THE INVENTION

This invention relates to estimating the probability of future values of a substantially periodic phenomenon. More specifically, the invention relates to an apparatus and method for making such estimations in ordering the views of a nuclear magnetic resonance (NMR) scan to reduce motion artifacts caused by periodic physiological motion.

NMR has been developed as an imaging method useful in diagnostic medicine. In NMR imaging, as is understood by those skilled in the art, a body being imaged is held within a uniform magnetic field oriented along a z axis of a Cartesian coordinate system.

The net magnetizations of the nuclei of the body are excited into precession by means of a radio frequency (RF) pulse and the decaying precession of the spins produces an NMR signal. The amplitude of the NMR signal is dependant, among other factors, on the number of precessing nuclei per volume within the imaged body termed the "spin density".

Magnetic gradient fields $G_x$, $G_y$, and $G_z$ are applied along the x, y and z axis to impress position information onto the NMR signals through phase and frequency encoding. A set of NMR signals may then be "reconstructed" to produce an image. Each set of NMR signals is comprised of many "views", a view being defined as one or more NMR signal acquisitions made under the same x and y gradient fields.

The length of time needed to acquire a sufficient number of views to reconstruct an image may be on the order of several minutes. Therefore, motion of the subject, including cardiac and respiratory motion, is inevitable. Such motion may produce blurring of the image or other image artifacts depending on the image reconstruction technique used.

One NMR image reconstruction technique, associated with "spin warp" imaging, will be described herein. It should be recognized however that the present invention may be advantageously practiced with other NMR image reconstruction techniques, such as multiple angle projection reconstruction as disclosed in U.S. Pat. No. 4,471,306.

Referring to FIG. 1, a typical "spin echo" pulse sequence for acquiring data under the spin warp technique includes: 1) a z-axis gradient $G_z$ activated during a first 90° RF pulse to select the image slice in the z axis, 2) a y-axis gradient field $G_y$ to phase encode the precessing nuclear spins in the y direction, and 3) an x-axis gradient $G_x$ activated during the acquisition of the NMR signal to frequency encode the precessing nuclear spins in the x direction. Two such NMR acquisitions, $S_1$ and $S_1'$, the latter inverted and summed with the first, comprise the NMR signal of a single view "A" under this sequence. Note that only the y gradient field $G_y$ changes between view "A" and subsequent view "B". This pulse sequence is described in detail in U.S. Pat. No. 4,443,760, entitled: "Use of Phase Alternated RF Pulses to Eliminate Effects of Spurious Free Induction Decay Caused by Imperfect 180 Degree RF Pulses in NMR Imaging", and issued Apr. 17, 1984 and assigned to the same assignee as the present invention Referring to FIG. 2, the acquisition of views to construct an image under spin warp imaging is illustrated by referring to the concept of k-space whose coordinates are $k_x$ and $k_y$. A two-dimensional slice of the imaged object 10 is subject to the pulse sequence of FIG. 1. The NMR signal comprising one view provides the values within a bounded area of k-space 12 along one "row" 14 of k-space 12 orientated along the $k_x$ axis. The particular row 14 is determined by the relative amplitude of $G_y$ for that NMR signal acquisition: for example, more positive y gradients (each measured by area) will produce the NMR signals filling higher row "numbers".

Under the spin warp imaging technique, once all the rows of the entire k-space area 12 are filled by repeated NMR signal acquisitions at different gradients $G_y$, the k-space area 12 is subject to a two-dimensional inverse Fourier transform along the $k_x$ and $k_y$ axes to produce the image 16.

The data acquired during a single view may be considered essentially instantaneous compared to the periods of cardiac and respiratory motion for typical NMR studies. The data for a given column in k-space, however, is acquired over many views and the time between the acquisition of the data at the top of a column in k-space and the bottom of the column may be substantial. For this reason, motion artifacts in spin warp imaging are generally disposed along the y-axis of the image corresponding to motion induced variations in the columnar k-space data Referring still to FIG. 2, if the imaged object 10 is stationary, the data read along a column of k-space 18 has frequency components dependant principally on the distribution of spin densities of the imaged object 10 in the y direction and the change in $G_y$ between views. If the imaged object 10 is moving, however, the data in each column 18 is modulated by the frequency of the movement and hence has frequency components corresponding to the modulation sidebands. These sideband frequencies will be discussed below.

The modulation of the data in a column of k-space by movement of the imaged object can best be understood by considering a single area element "a" in the slice of imaged object 10. As object 10 moves, new material will move into area "a" possibly with a higher or lower spin density. This change in spin density in turn will amplitude modulate the data in k-space 12. Of course, if the areas around area "a" in the imaged object 10 have approximately the same spin density as area "a", no modulation will occur. This corresponds with the observation that motion artifacts are most concentrated around areas of abrupt changes in spin density. Additionally, as object 10 moves, signal from area "a" may have a different spin phase due to, for example, motion in the presence of field gradients. This change in spin phase will phase modulate the data in k-space.

Both amplitude modulation and phase modulation of the data in a column of k-space 18 by motion of the imaged object 10 create frequency side bands understood by those familiar with the principles of modulation. These side bands, when transformed by the image reconstructing Fourier transforms to produce image 16, become visible as repetitions or "ghosts" on either side of high contrast image elements "a". Generally, as discussed, these ghosts are displaced in the y direction.

U.S. Pat. Nos. 4,663,591 and 4,706,026 both entitled: "Method for Reducing Image Artifacts due to Periodic Signal Variations in NMR Imaging", issued on May 5, 1987 and Nov. 10, 1987, respectively, and incorporated herein by reference, describe ghost artifacts resulting from periodic motion in the image object and disclose a method of reducing such artifacts by changing the order in which NMR views are acquired.

The order in which NMR views are acquired and hence the order in which the rows of k-space are filled depends on the order in which the gradient amplitudes of $G_y$ are applied during the NMR signal acquisition. By controlling the order of filling the rows in k-space 12, with regard to the modulation of the NMR signal by the motion of the imaged object 10, the apparent modulation of a column of k-space data 18 may be radically altered.

Specifically, if the k-space rows 14 are acquired so that the row number corresponds with the degree of modulation of the NMR signal, the apparent modulation of the data in a k-space column 18 will be decreased in frequency. This ordering strategy is termed a "low sort" and results in a compression of the ghost artifacts toward area "a". This compression will allow distant structures to be more easily viewed.

Conversely, if the k-space rows are acquired so that odd rows correspond to large values of modulation and even rows correspond to low values of modulation the apparent modulation of the data in a k-space column 18 will be increased in frequency. This ordering strategy is termed a "high sort" and results in an expansion of the ghost artifacts away from area "a". If this expansion is sufficient, it may move the ghosts out of the field of view of the image 16, effectively causing the ghosts to disappear.

It should be noted that the sorting order of the rows: "high sort" or "low sort", must be determined at the time of the NMR data acquisition. The rows may not be collected and then rearranged subsequently for the best sort because $G_y$, which defines the row number, is necessarily fixed at the time the NMR data is acquired. It is necessary, therefore to anticipate the phase of the modulating physiological motion in advance to determine which row to acquire.

U.S. Pat. No. 4,720,678 entitled: "Apparatus and Method for Evenly Distributing Events over A Periodic Phenomenon" issued Jan. 19, 1988, and incorporated herein by reference, describes several methods of predicting the phase of a generally periodic physiological motion. These methods are adapted for use in selecting row ordering in an NMR scan so as to produce "high" or "low" sorting as described above. One such method, as applied to respiration will be briefly summarized as follows:

Referring to FIG. 3(a) a representative respiration waveform 20, as may be produced by a belt type respiration transducer measuring chest wall extension, has a periodic amplitude variation y(t). This waveform 20 is sampled for a period of time to determine its extreme values and the probability density function of its values over time. The probability density function of waveform 20 is simply a measure of the relative probability that the respiration waveform 20 will have a value within a given amplitude range. For the generally sinusoidal respiration waveform 20 shown in FIG. 3(a), the probability density function will be highest for values near the waveform's crest and trough because a relatively greater amount of time is spent by the waveform 20 at these values than at values at the center of the waveform 20. In practice, a probability density function may be acquired by tallying the particular values of a waveform on a histogram whose horizontal axis defines intervals of waveform value and whose vertical axis defines number of occurrences divided by total occurrences.

The probability density histogram of respiration waveform 20 may be integrated along its horizontal axis to produce an "integral histogram" which indicates the probability that the waveform 20 will have a value equal to or less than the value indicated on the horizontal axis. For purposes of graphical clarity, the integral histogram 22, shown in FIG. 3(b), has been rotated so that its vertical axis is waveform value, to coincide with the vertical axis of FIG. 3(a) which also shows waveform value. The horizontal axis of the integral histogram 22 of FIG. 3(b) shows probability.

The integral histogram 22 serves as a transfer function that maps values of the respiration waveform 20, whose values vary in probability of occurrence, to a triangle waveform 24, shown in FIG. 3(d), whose values are equally probable. The triangle waveform 24 will be termed phase and denoted $\phi(y)$ because it is a linear function of time related to the amplitude of the respiratory waveform y(t). The phase $\phi(y)$ is used to determine which view or row of k-space should be next acquired so as to reduce any motion artifacts as will be described further below.

Referring to FIG. 3(b), prior to the NMR signal acquisitions, each value $G_y(i)$ is assigned to an evenly spaced gradient reference phase value $\phi_{ref}(i)$ shown along the horizontal axis of the integral histogram 22. For the low sort to be illustrated, negative gradient values $G_y(i)$ are assigned to low phase values $\phi_{ref}(i)$. Hence, in this example, i may be considered a row number in k space. For clarity only eleven reference phase and gradient values are shown.

Immediately before an NMR signal acquisition, the value of the respiration waveform 20 is sampled, the closest reference phase value $\phi_{ref}(i)$ is determined from the histogram 22, and the associated $G_y(i)$ value is chosen. Referring to FIG. 3(a) at time $t_1$ the respiration waveform 20 is at an amplitude $y(t_1)$ indicated by point "A". Referring to the integral histogram 22 of FIG. 3(b) the amplitude of sample "A" corresponds to reference phase $\phi_{ref}(0)$ and the gradient value $G_y(-5)$. The NMR signal is thus acquired with gradient $G_y(-5)$ and stored in the proper elements of an array representing the zero-th k-space row 14.

Immediately before the time of the next NMR acquisition, $t_2$, the respiration waveform 20 is sampled at point "B" whose amplitude corresponds to a reference phase $\phi_{ref}(3)$ and a gradient $G_y(-2)$. Again the NMR signal is acquired and the third k-space row 14 filled. This process is continued until each gradient $G_y(i)$ has been used which indicates that the array in k-space 12 is complete. The k-space rows are thus not acquired in numerical order but are "reordered" by the use of the integral histogram 22. The reordered k-space data 12 is ultimately processed by a two dimensional Fourier transform to reveal an image 16 as has been discussed.

The amplitude of the respiration waveform 20 at the time of the acquisition of the NMR signal, and thus for each row of k-space, is shown in the plot in FIG. 3(c). The change in amplitude of the respiration waveform 20 with k-space row number reflects the possible modulation of the data in a k-space column, and hence the plot of FIG. 3(c) is named "modulation in k-space".

As may be seen, acquiring the k-space rows according to the integral histogram lowers the modulation frequency of plot 22 in comparison to that which would be obtained if the k-space rows were acquired in numerical order. As discussed above, this lowering of the frequency of respiration induced modulation will tend to compress the ghost artifacts in the resulting image 16.

This example of the ghost reduction technique of U.S. Pat. No. 4,720,678, cited above, incorporates a number of simplifications. First, the amplitude $y(t_i)$ of the respiration waveform 20, at a given sampling time $t_i$, may not produce a phase value $\phi(y_i)$, when transformed by integral histogram 22, that is equal to any reference phase $\phi_{ref}(i)$. The acquisition of the NMR signal at times $t_i$ occurs at an essentially constant rate, dictated by the particular pulse sequence, and is independent of the amplitude of the respiration waveform 20. In cases where the phase of the sampled value $\phi(y_i)$ does not match any reference phase $\phi_{ref}(i)$, the closest reference phase $\phi_{ref}(i)$ will be chosen.

The second simplification is that the above example ignores the possibility that two samples will have values $y(t_i)$ corresponding to the same reference phase $\phi_{ref}(i)$. The even spacing of the reference phases values $\phi_{ref}(i)$ within the range of the equiprobable phase function $\phi(y)$ reduces the chance that the phase $\phi_{ref}(i)$ will be selected twice prior to all other phase values $\phi_{ref}$ being selected once. This is the advantage of the integral histogram transformation. However, if a sampled value of the respiration waveform 20 matches a given reference phase $\phi_{ref}(i)$ that has already been used, the next closest unused reference phase $\phi_{ref}(i)$ will be chosen instead.

It may be noted that these problems of matching the values of the respiration waveform $y(t_i)$ to a particular reference phase value $\phi_{ref}(i)$ arise only because the NMR image must be acquired in a short period of time. If time were no object, the precise value of $y(t_i)$ corresponding to a particular reference phase $\phi_{ref}(i)$ could be obtained. Thus errors resulting from imperfect matching of the values of the respiration waveform $y(t_i)$ to a particular reference phase value $\phi_{ref}(i)$ will be termed "sampling limitation errors".

A third simplification in the example of FIGS. 3(a)–(d) is in the uniformity of the respiration waveform 20. Typically such waveforms vary in amplitude, baseline, shape, and frequency. The predictive accuracy of the integral histogram 22 is not affected by changes in respiration waveform frequency but suffers if the amplitude of the respiration waveform 20 as measured from crest to trough, or if the baseline of respiration waveform 20, measured along the troughs or the shape of the waveform, varies during the acquisition of the NMR signals.

Referring to FIG. 4(a), a varying respiration waveform 28 has an amplitude which decreases after the compilation of the integral histogram 22 shown in FIG. 4(b). Applying a "low sort" to the sampled data points in respiration waveform 28, as described above, yields the jagged plot of modulation in k-space 30 of FIG. 4(c). The fluctuations in respiration amplitude values in this modulation plot 30 impairs the effect of the low sort by introducing high frequency modulation into the k-space data.

The jagged peaks in plot 30 result from failure of the histogram 22 to accurately predict the probability of the values of respiration waveform 28 after its drop in amplitude. The failure of prediction results in early gradients $G_y(i)$ being mis-assigned, which in turn, forces later gradients $G_y(i)$ to be assigned to inappropriate respiration values. It will be apparent from this discussion that a similar problem will arise for changes in the baseline of the respiration waveform 28 and that similar problems will also affect "high sort" strategies. The errors resulting from failure of the histogram 22 to reflect the probability of values of the respiration waveform 28 as it changes will be termed "prediction errors" to distinguish them from "sampling limitation errors" described above and from a third type of error to be discussed below.

The prior art has addressed "prediction errors" resulting from unstable respiration waveforms in two ways. First the waveform may be preprocessed by automatic gain control ("AGC") and automatic offset control ("AOC") circuitry so that the integral histogram transfer function is presented with an essentially constant amplitude respiration waveform with constant baseline. Second, the histogram may be continually updated by adding new data to the histogram and discarding the oldest data in a "rolling" fashion. Changes in amplitude or baseline will thus be rapidly accommodated by the integral histogram which changes shape.

Inevitably, however, changes in the integral histogram will change the functional relationship between $y(t)$ and $\phi$. Referring to FIG. 5(a), a respiration signal 29, similar to that of respiration waveform 28 of FIG. 4(a), changes in amplitude at time $t_c$. Two histogram curves 30 and 32 represent the probabilities of the values of the respiration waveform before time $t_c$ and after time $t_c$ respectively. By using histogram 30 for sampled points of respiration waveform prior to $t_c$ and using histogram 32 for sampled points subsequent to time $t_c$, the goal of a rapidly adapting histogram may be achieved.

FIG. 5(c) shows the modulation of data in k-space based on the view ordering using histograms 30 and 32. Clearly, the matching of respiration waveform values to rows in k-space has significant errors despite the rapid adaptation of the histogram of FIG. 5(b) to the respiration waveform. Although the histogram curves 30 and 32 accurately reflect the probability of values of the respiration waveform on an instantaneous basis, the functional relationship between $y(t)$ and $\phi$ during the matching of respiration values to gradients $G_y$ is weakened. Points H, I, J, and K map perfectly to reference gradients 1, 4, 7, and 10, on histogram curve 32 and are correctly ordered with respect to each other, however the actual values $y(t_i)$ have no correspondence to the values of $y(t_i)$ selected by histogram 30. These errors in ordering, resulting from the change in the histogram during the matching of values to elements, will be termed "correspondence errors". It is important to note that "correspondence errors" are exacerbated by rapid changes in the histogram curve, the very method that is used to reduce "prediction errors" as described above.

It should be noted additionally that correspondence errors will also occur if the histogram is held fixed and the respiration waveform is preprocessed by AGC and AOC circuitry. AGC and AOC processing accomplishes the same end as does rapid updating of the integral histogram. Both procedures weaken the relationship between $y(t)$ and $\phi$.

SUMMARY OF THE INVENTION

The invention provides a method of associating a current value $y(t_i)$ of a substantially periodic signal $y(t)$ with an element in a set $G_y(i)$ so that the value $y(t_i)$ has a predetermined relationship to the element $G_y(i)$'s order within the set $G_y$. The method involves first acquiring a database of $N_t$ samples of the substantially periodic signal y(t) then growing the database by adding the sampled value y(t$_i$) to the database. The relative probability of the values of the substantially periodic function y(t) are determined from the samples in the growing database.

The value y(t$_i$) is assigned to an element G$_y$(i), using the evaluated relative probability, so as to maximize the probability that subsequent values of y(t) may be assigned the remaining elements of set G$_y$ according to the predetermined relationship.

It is thus one object of the invention to improve the matching of current values of the periodic function to elements of the ordered set when the periodic signal changes in amplitude or baseline. More specifically, the present invention addresses errors in the matching of elements to values caused by "correspondence errors" as have been distinguished from "sampling limit errors" and "prediction errors". The trade-off between "prediction errors" and "correspondence errors" is met in the present invention by allowing the data base to "grow" during the sorting process. In "growing" the data base, no data acquired during the sorting process is discarded and the long term functional relationship between y(t) and $\phi$ is improved.

A "rolling" data acquisition is begun prior to starting a scan and is changed to a "growing" data acquisition N$_T$ samples after the first NMR signal is acquired. The AOC and AGC are also deactivated after the first NMR signal is acquired to eliminate additional factors affecting the relationship between y(t) and $\phi$.

In an alternative embodiment, the database is "frozen" during the sorting process by neither adding nor removing data from the database. By freezing the database, correspondence errors can be much reduced, although at the expense of increasing prediction errors.

An overscanning period follows the initial scanning and sorting to improve the accuracy of the sorting. At the beginning of the overscanning period, the database is frozen and the substantially periodic waveform y(t) is sampled to obtain an overscan value y$_s$(t$_n$). The overscan value y$_s$(t$_n$) is used to replace a previously assigned value y(t$_i$), so that the relationship between the assigned values of y(t) and the elements of set G$_y$ is made closer to the predetermined relationship.

It is therefore another object of the invention to permit subsequent correction of the assignment of values to elements by additional overscanning. The use of a growing or frozen database rather than a rolling data base preserves the error information necessary for subsequent correction of scanned values during overscan. A rolling data base loses the early histogram data and as a result the early errors in sorting cannot be detected.

The foregoing and other objects and advantages of the invention will appear from the following description. In the description, reference is made to the accompanying drawings which form a part hereof and in which there is shown by way of illustration, a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 4(a) is a plot of amplitude versus time for a respiration waveform y(t) exhibiting variations in amplitude over time;

FIG. 4(b) is an integral histogram compiled prior to the change in amplitude of the respiration waveform of FIG. 4(a) being essentially the same as the integral histogram of FIG. 3(b);

FIG. 4(c) is a plot of the amplitude of the respiration waveform of FIG. 4(a) associated with an NMR signal versus the row number of that NMR signal's view in k-space as sorted according to the integral histogram of FIG. 4(b);

DESCRIPTION OF THE PREFERRED EMBODIMENT

Figure 1:
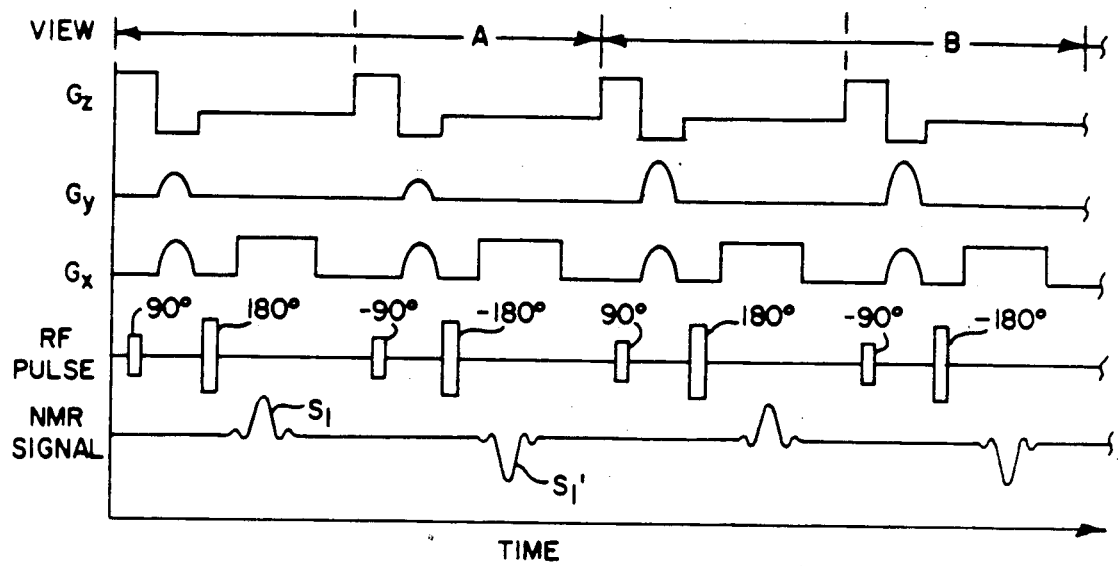
FIG. 1 is an exemplary NMR imaging pulse sequence of a type used in two-dimensional spin warp imaging.
Figure 2:
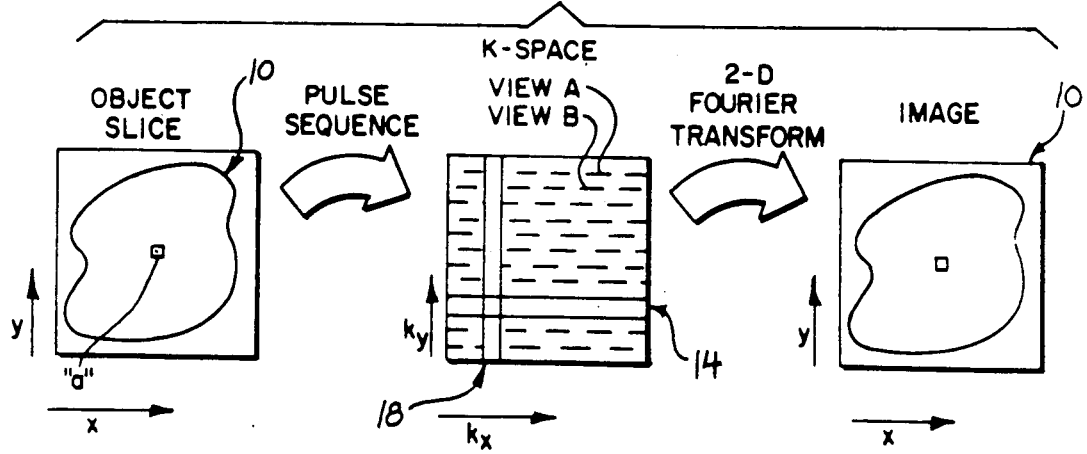
FIG. 2 is a schematic representation of the data transformations in spin warp imaging showing the relationship of the imaged object to k-space and the final image.
Figure 3C:
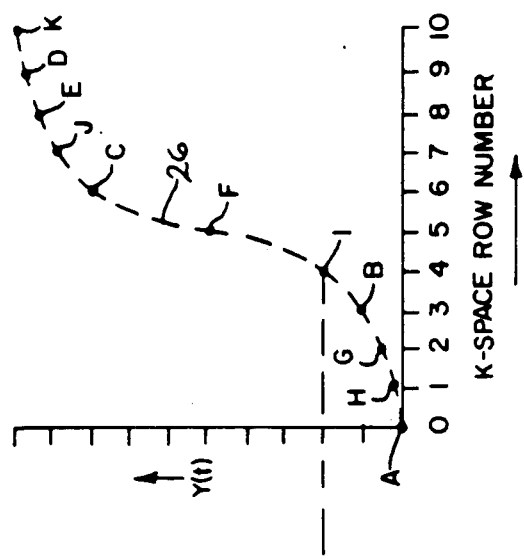
FIG. 3(c) is a plot of the amplitude of the respiration waveform of FIG. 3(a) associated with an NMR signal versus the row number of that NMR signal's view in k-space as sorted according to the integral histogram of FIG. 3(b)
Figure 3B:
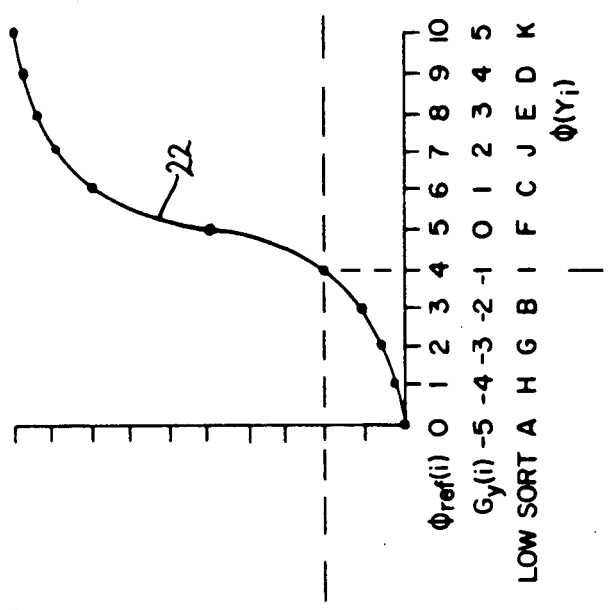
FIG. 3(b) is an integral histogram compiled from one cycle of the respiration waveform shown in FIG. 3(a)
Figure 3A:
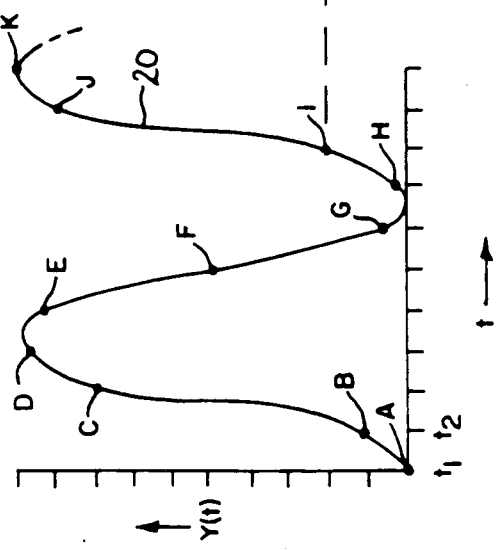
FIG. 3(a) is a plot of amplitude versus time for a representative respiration waveform y(t) produced by a respiration transducer.
Figure 3D:
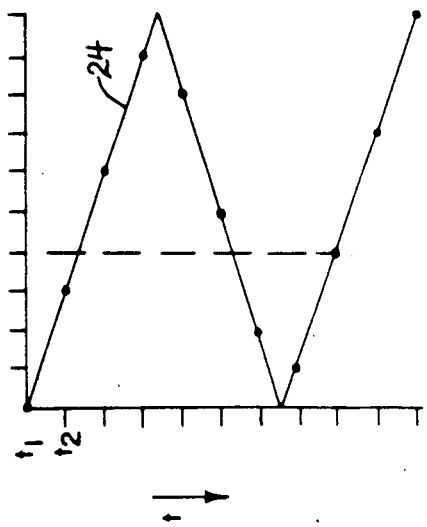
FIG. 3(d) is a plot of the phase $\phi$(t) of the respiratory waveform of FIG. 3a versus time as derived from the integral histogram of FIG. 3(b)
Figure 5A:
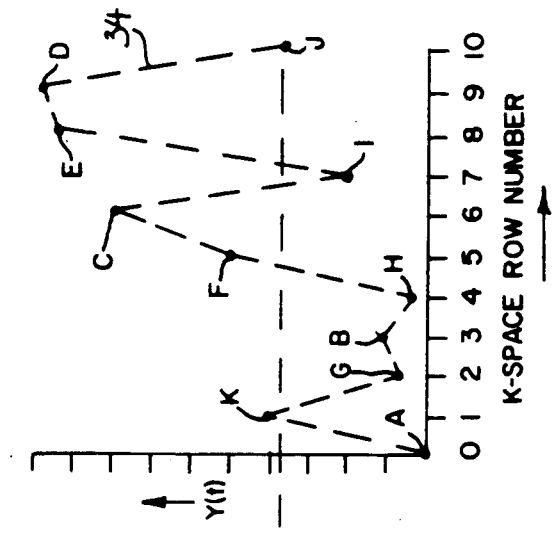
FIG. 5(a) is a plot of amplitude versus time for a respiration waveform exhibiting a change in amplitude at time t$_c$ per FIG. 4(a)
Figure 5B:
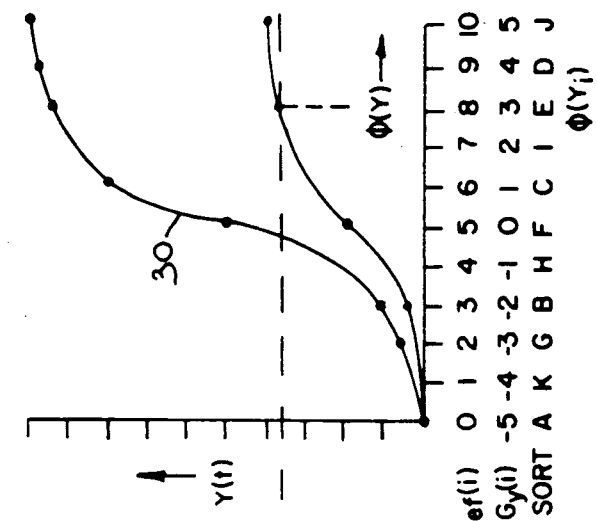
FIG. 5(b) shows two integral histogram curves, one representing transfer function $\phi$(y) for the respiration waveform of FIG. 5(a) prior to its change in amplitude at time t$_c$ and one representing the phase transfer function $\phi$(y) of the respiration waveform after its change in amplitude at time t$_c$. Together the histogram plots provide a histogram that adjusts instantaneously to reflect changes in the respiratory waveform of FIG. 5(a), a condition that may be approached with automatic gain and offset control or a rapidly updated histogram database.
Figure 5C:
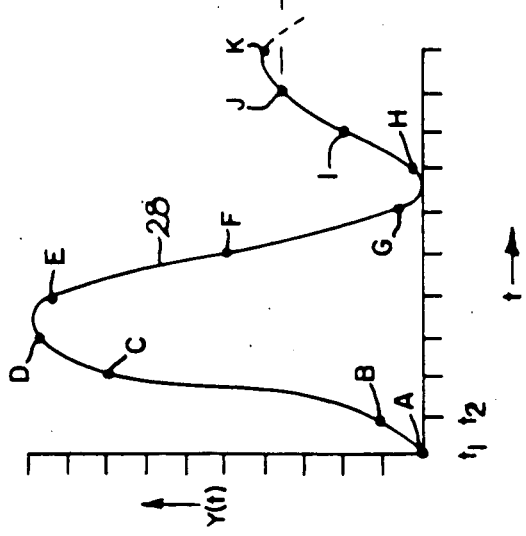
FIG. 5(c) is a plot of the amplitude of the respiration waveform of FIG. 5(a) associated with an NMR signal versus the row number of the NMR signal's view in k-space as sorted according to the integral histogram of FIG. 5(b)
Figure 6:
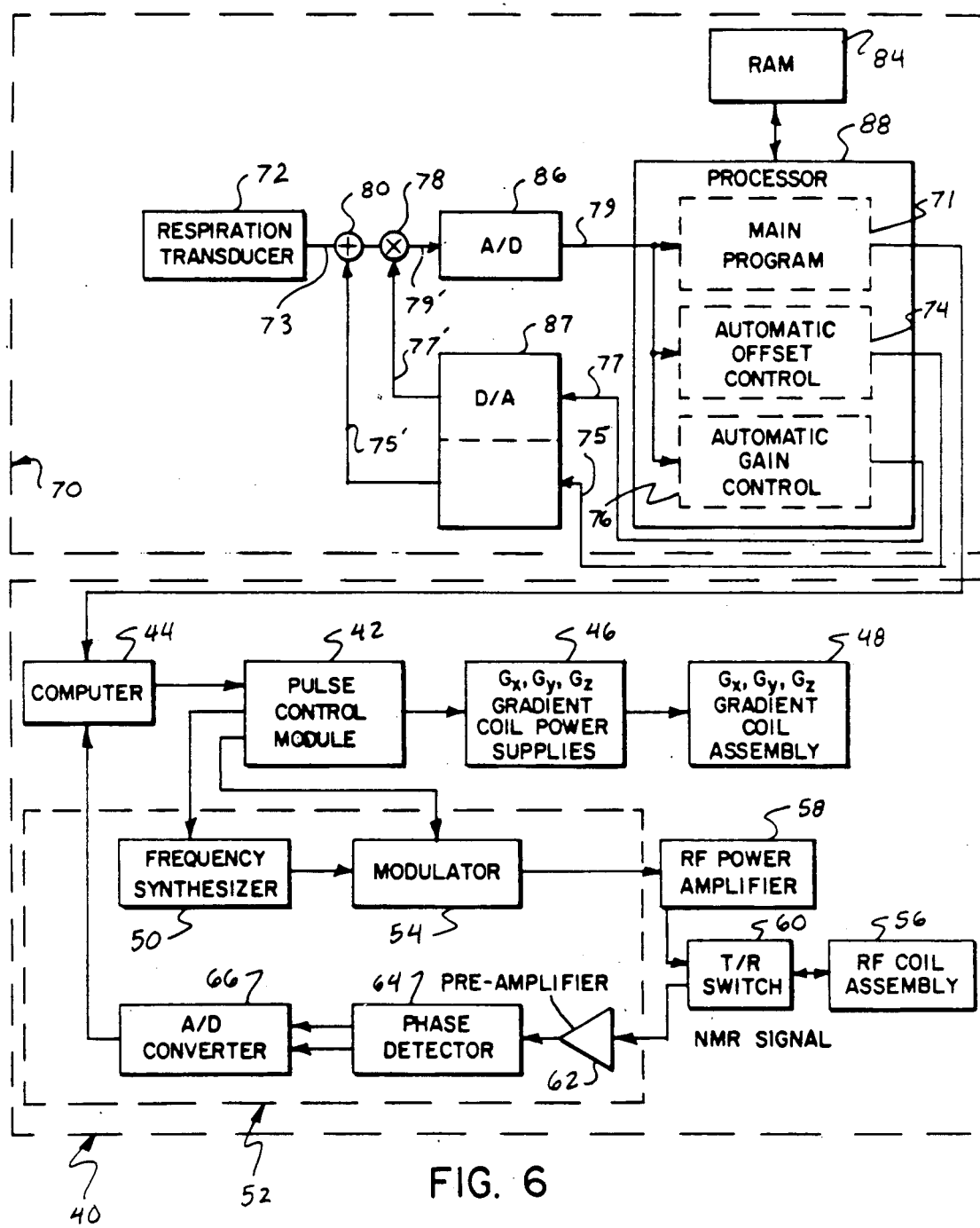
FIG. 6 is a block diagram of an exemplary NMR system incorporating an apparatus for supplying gradient ordering information in accordance with the present invention.

Referring to FIG. 6, an NMR system generally designated 40, includes a pulse control module 42 which provides properly timed pulse sequences such as that shown in FIG. 1 for spin warp imaging, under the control of a computer 44. The pulse control module 42 controls, in turn, gradient power supplies 46 which produce the gradients G$_x$, G$_y$, and G$_z$ as described above, by means of gradient coils 48.

The pulse control module 42 also controls a radio frequency synthesizer 50 which is part of an RF transceiver system, portions of which are enclosed by dashed line block 52. The pulse control module 42 also controls an RF modulator 54 which modulates the output of the radio frequency synthesizer 50. The resultant RF signals, amplified by power amplifier 58 and applied to RF coil 56 through transmit/receive switch 60, are used to excite the nuclear spins of the imaged patient (not shown).

The NMR signals from the excited nuclei are picked up by the RF coil 56 and presented to preamplifier 62 through transmit/receive switch 60, to be amplified and then processed by a quadrature phase, detector 64. The detected signals are digitized by a high speed A/D converter 66 and applied to computer 44 for processing to produce NMR images of the object.

A respiration monitoring system, generally designated 70, is connected to the NMR system 40 to provide the computer 44 with ordering information for the gradients $G_y$ per the present invention. A respiration transducer 72 produces a respiration signal dependant on the chest wall position of the imaged patient. Such a transducer may be a mechanical bellows-type, belt transducer that measures chest motion.

The respiration signal 73 is received by summing junction 80 and voltage controlled amplifier 78 which adjust the baseline and amplitude of the respiration signal according to an offset control value 75' and a scaling value 77' to be described below. The adjusted signal 79' is processed by an analog-to-digital converter ("A/D") 86 which provides a digitized representation of the respiration signal 79 to processor 88. The digitized respiration signal 79 is applied to processor 88 which stores certain values of the respiration signal y(t) in a database in random access memory ("RAM") 84 for use in calculating the phase values $\phi(y)$ as have been described. The phase values $\phi(y)$ are used to select the order of the gradients $G_y$ in the NMR scan and are calculated by a main program 75 and communicated to the pulse control module 42 through computer 44.

The processor 88 additionally computes a scaling value 77 and an offset value 75 by means of an automatic gain control program 76 and an automatic offset control program 74. These values are converted to analog signals 77' and 75' respectively by digital-to-analog converter ("D/A") 87 and received by the voltage controlled amplifier 78 and the summing junction 80 as described above.

As will be seen, the precise implementation of the automatic gain control and automatic offset control are not critical, but serve generally to center the respiration signal within the range of the ADC 86 as is well understood in the art. The amplitude of the respiration signal is controlled to be approximately 3 volts peak to peak with a baseline of 2 volts. The time constant of the AGC is approximately 20 seconds and the time constant of the AOC is approximately 20 seconds.

In accordance with the invention, the respiration signal y(t) is mapped to an equiprobable phase signal. In order to determine the phase transfer function $\phi(y)$, an integral histogram is compiled on a value by value basis from a database which stores previous values of the respiration signal y(t). The acquisition of the data for the database will be discussed in detail below.

Each value $\phi(y)$ may be calculated as needed from the data base according to the following formula:

$$\phi(y_i) = (N_L + (N_E/2))/N_T \qquad (1)$$

where $N_L$ is the number of values of y(t) in the data base with a value less than $y_i$, $N_E$ is the number of values of y(t) in the database with a value equal to $y_i$, and $N_T$ is the total number of entries in the data base. Calculation of the histogram from a database of periodic signal values is described in detail in the above cited U.S. Pat. No. 4,720,678.

As was discussed above, the database data must be acquired in a manner that strikes a balance between "prediction errors" resulting from a slowly changing or unchanging histogram, and "correspondence errors" resulting from a histogram that changes too quickly.

Figure 7:
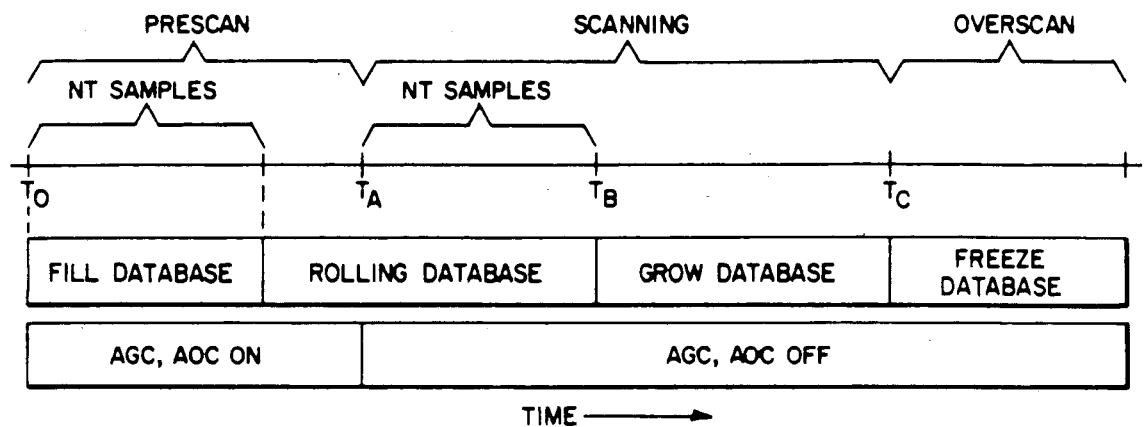
FIG. 7 is a timing diagram showing the method of acquiring respiration data in accordance with the present invention.

Referring to FIG. 7, during a prescan period after time $T_O$ and prior to the beginning of the scan at time $T_A$, sampled data from the respiration waveform is collected from the gain and offset controlled respiration signal y(t) to fill the database stored in RAM 84. The size of the database $N_T$ is initially set to 667 samples as determined from the following formula:

$$N_T = T/\Delta t \qquad (2)$$

where T is 20 seconds, approximating 3 average breathing cycles, and $\Delta t$ equals the sample rate of the low speed A/D converter of approximately 30 ms.

After $N_T$ samples have been acquired, the data acquisition enters a "rolling" mode where the earliest sampled value of y(t) is replaced with the latest sampled value of y(t) so that the total number of samples $N_T$ remains constant. Sufficient data has now been collected to permit the construction of an integral histogram according to equation 1 above.

At time $T_A$ after the rolling data acquisition has begun, NMR scanning is initiated. The offset control value 75' and scaling value 77' are frozen. Phase values $\phi(y_i)$ are computed and gradients $G_y(i)$ assigned to the acquired NMR signals as described above. At time $T_b$, when $N_T$ samples have been acquired after $T_A$ the data acquisition switches from a "rolling" mode to a "growing" mode. In the growing mode, $N_T$ is increased for each additional value of y(t) sampled and no data in the database is deleted. With a growing database, during the early portion of the scan, each respiration value $y(t_i)$ is evaluated against a histogram compiled of relatively little data $N_T$. The histogram may change more quickly to accommodate changes in the breathing pattern and in the early part of the scan, such changes are acceptable because relatively few gradient values have been used. Late in the scan there is considerably more data in the database and changes in the breathing pattern do not affect the histogram as much. This satisfies the requirement that the changes in the histogram be limited after more gradients have been sorted so that the sorting of the earlier gradients "corresponds" with the sorting of the later gradients.

In an alternative embodiment, the database is "frozen" rather than "grown" during the scan, that is, no additional data is entered nor removed from the database. This further limits the changes in the histogram and ensures that the earliest sorting will correspond with the later sorting during the scan, but at the expense of the accuracy of the predictive accuracy of the histogram.

At time $T_c$, after a complete set of NMR views have been acquired, as dictated by the image resolution hence the number of rows in k-space that must be filled, overscan is begun. The database is "frozen", that is, no data is added or deleted from the database with the taking of additional samples of the respiration function $y_s(t_n)$.

During the overscan process, additional NMR signals are acquired and used to reduce "sampling limitation errors" and "prediction errors" in the sorting of respiration signal amplitude values $y(t_i)$ among gradients $G_y(i)$.

Figure 8:
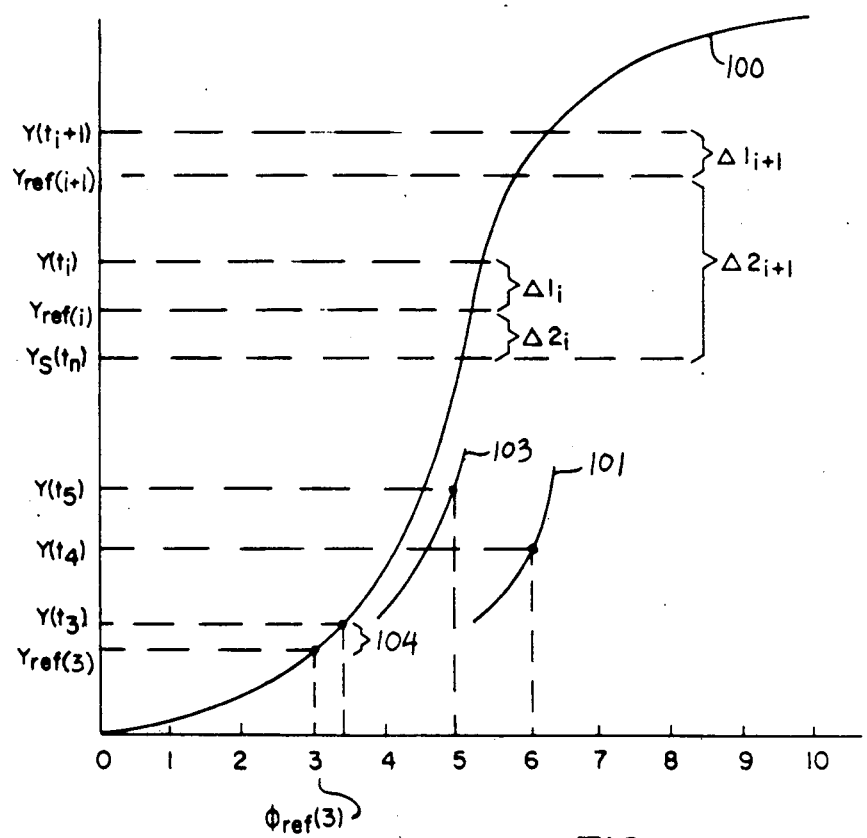
FIG. 8 is a representative integral histogram obtained in accordance with the present invention illustrating the method of correcting errors during overscan.

Referring to FIG. 8, a histogram 100 is produced from the data in a data base that is frozen at the beginning of the overscan period $T_c$. By storing the values of $y(t_i)$ associated with each reference phase values $\phi_{ref}(i)$ previously matched during the sorting process, "sampling limitation errors" and "prediction errors" may be measured and corrected.

The measurement of a sampling limitation error may be shown in the following example. For simplicity, it will be assumed in this example that the integral histogram 100 is identical to the integral histogram existing when the reference phase $\phi_{ref}(3)$ was originally matched to the respiration value $y(t_3)$. Following the integral histogram curve 100, however, it is seen that $y(t_3)$ does not correspond exactly with phase $\phi_{ref}(3)$, but rather with a phase slightly removed from $\phi_{ref}(3)$ toward $\phi_{ref}(4)$. Under the above described matching procedure, however, it will be assumed that $\phi_{ref}(3)$ was chosen as the closest reference phase. A resultant "sampling limitation error", then, may be measured by the difference 102 between $y(t_3)$ and a y-reference value $y_{ref}(3)$, the latter equal to the value of the histogram 100 at the reference phase $\phi_{ref}(3)$. As noted before, sampling limitation errors would not occur if unlimited time were available to wait for respiration values $y(t)$ that mapped perfectly to a reference phase value $\phi_{ref}(i)$. Conversely, sampling limitation errors will occur, under conditions of limited sampling time, even if the histogram predicting the respiration waveform does not change, especially at the end of the scan when fewer unused reference phase values are left.

Prediction errors, on the other hand result solely from changes in the histogram, that is, failure of the early histograms to accurately predict the entire duration of the respiration waveform. The measurement of a prediction error may be shown in the following example: During the original sorting process, a sample of the respiration waveform $y(t_4)$ may map to reference phase $\phi_{ref}(6)$ by virtue of an early histogram 101. Later, higher valued sample $y(t_5)$ may map to lower reference phase $\phi_{ref}(5)$ as a result of evolution of the histogram into form 103. Both of these assignments were correct according to the histogram available at the time of the assignment, but these assignments are clearly wrong in relationship to each other, as is the sorting, because of the changes in the histogram. Yet these changes in the histogram are the result of its evolution toward increasing accuracy as new data is collected. In the overscan process, these prediction errors are corrected by reference to a single unchanging histogram 100 based on the frozen database to avoid further such problems.

Both "sampling limitation errors" and "prediction errors" are corrected in the same way: by comparison of the $y(t_i)$ values associated each NMR view during the previous sorting to $y_{ref}(i)$ values derived from the frozen histogram 100. Referring still to FIG. 8, corrections of "sampling limitation errors" and "prediction errors" as measured against the frozen histogram 100 are made by sampling the respiration waveform during overscan immediately prior to each overscan NMR signal acquisition. The samples of the respiration function taken during overscan will be designated $y_s(t_n)$. For each view, a first difference $\Delta 1_i$ is calculated by subtracting the $y(t_i)$ value associated with that view (from the previous sorting) from the $y_{ref}(i)$ value determined by means of the histogram 100. A second difference $\Delta 2_i$ is produced by subtracting the overscan value $y_s(t_n)$ from the reference value $y_{ref}(i)$ for each view. An error improvement term $\epsilon_i$ is then derived for each view by subtracting the absolute value of $\Delta 2_i$ from the absolute value of $\Delta 1_i$. The overscan value $y_s(t_n)$ replaces the original scanned value $y(t_i)$, if $\epsilon_i$ is positive, for that view with the largest $\epsilon_i$.

A preferred embodiment of the invention has been described, but it should be apparent to those skilled in the art that many variations can be made without departing from the spirit of the invention. For example the respiration signal $y(t)$ may be replaced with other signals representing substantially periodic motion capable of producing motion artifacts, such as cardiac motion. Also the exact trade-off between reduction of "prediction errors" versus the reduction of "sampling limitation errors" may be adjusted by changing the proportion of time during the scan that the data base is "grown" or "frozen" versus "rolled".

I claim:

1. A method of associating a sampled value $y(t_i)$ of a substantially periodic signal $y(t)$, with an element $G_y(i)$ in a set $G_y$, such that the sampled value $y(t_i)$ has a predetermined relationship to the order of the element $G_y$ within the set, comprising the steps of:
   (a) acquiring a database of $N_t$ samples of the substantially periodic signal $y(t)$;
   (b) growing the database by adding the sampled value $y(t_i)$ to the database without removing another sample from the database;
   (c) evaluating the relative probability of the values of the substantially periodic function $y(t)$ from the samples in the growing database; and
   (d) assigning the value $y(t_i)$ to an element $G_y(i)$, using the evaluated relative probability, so as to maximize the probability that subsequent values of $y(t)$ may be assigned the remaining elements of set $G_y$ according the predetermined relationship.

2. The method of claim 1 wherein step (a) further comprises rolling the database by storing new samples of the substantially periodic signal $y(t)$ in the data base and discarding the oldest samples stored in the database so as to maintain $N_t$ samples.

3. The method of claim 1 wherein steps (c) and (d) are performed by:
   assigning a reference phase $\phi_{ref}(i)$ to each element $G_y(i)$ of the set $G_y$ such that the relationship between the value of the reference phase $\phi_{ref}(i)$ and the order of the element $G_y(i)$ in the set $G_y$ is the same as that desired between the value of the substantially periodic signal $y(t_i)$ and the order of the element $G_y(i)$;
   producing a current phase $\phi(y_i)$ from the current value of the periodic signal $y(t_i)$, by using the database, so that the probability density of the current phase values $\phi(y_i)$ produced is substantially more uniform than the probability density of the current values of the periodic signal $y(t_i)$; and
   associating the current value of the periodic signal $y(t_i)$ with an element of the set $G_y(i)$ according to the differences between the current phase $\phi(y_i)$ and the closest available reference phase $\phi_{ref}(i)$.

4. The method of claim 1 wherein the values of a periodic signal $y(t_i)$ are values of physiological motion of an imaged body during an NMR imaging scan and wherein the elements of the ordered set $G_y(i)$ are magnitudes of a phase encoding gradient and wherein the relationship between the values of the periodic function and the element's order is selected to reduce motion artifacts resulting from the physiological motion.

5. The method of claim 1 wherein the values of the periodic function y(t) are scaled and offset by automatic gain control (AGC) circuitry and automatic offset control (AOC) circuitry prior to being stored in the data base and wherein the scaling and offset values are fixed prior to step (b).

6. The method of claim 1 wherein the values of the periodic function y(t) are scaled and offset by automatic gain control (AGC) circuitry and automatic offset control (AOC) circuitry prior to being stored in the data base and wherein the scaling and offset values are fixed prior to step (b).

7. A method of associating a value $y(t_i)$ of a substantially periodic signal y(t), with an element $G_y(i)$ in a set $G_y$, such that the value $y(t_i)$ has a predetermined relationship to the order of the element $G_y(i)$ within the set, comprising the steps of:
   (a) recording in a database $N_t$ samples of the substantially periodic signal y(t);
   (b) freezing the database by neither adding nor removing samples;
   (c) evaluating the relative probability of the values of the substantially periodic function y(t) from the samples in the frozen database; and
   (d) assigning the value $y(t_i)$ to an element $G_y(i)$, using the evaluated relative probability, so as to maximize the probability that subsequent values of y(t) may be assigned the remaining elements of set $G_y$ according the predetermined relationship.

8. The method of claim 7 wherein step (a) further comprises rolling the database by storing new samples of the substantially periodic signal y(t) in the data base and discarding the oldest samples stored in the database so as to maintain $N_t$ samples.

9. The method of claim 7 wherein step (d) is performed by:
   assigning a reference phase $\phi_{ref}(i)$ to each element $G_y(i)$ of the set $G_y$ such that the relationship between the value of the reference phase $\phi_{ref}(i)$ and the order of the element $G_y(i)$ in the set $G_y$ is the same as that desired between the value of the substantially periodic signal $y(t_i)$ and the order of the element $G_y(i)$;
   producing a current phase $\phi(y_i)$ from the current value of the periodic signal $y(t_i)$, by using the database, so that the probability density of the current phase values $\phi(y_i)$ produced is substantially more uniform than the probability density of the current values of the periodic signal $y(t_i)$; and
   associating the current value of the periodic signal $y(t_i)$ with an element of the set $G_y(i)$ according to the differences between the current phase $\phi(y_i)$ and the closest available reference phase $\phi_{ref}(i)$.

10. The method of claim 9 wherein step (a) is performed by growing the database by adding the sample $y(t_i)$ to the data base without removing an older sample from the database.

11. The method of claim 9 wherein step (a) further is performed by rolling the database by storing new samples of the substantially periodic signal y(t) in the data base and discarding the oldest samples stored in the database so as to maintain $N_t$ samples.

12. The method of claim 7 wherein the values of a periodic signal $y(t_i)$ are values of physiological motion of an imaged body during an NMR imaging scan and wherein the elements of the ordered set $G_y(i)$ are magnitudes of a phase encoding gradient and wherein the relationship between the values of the periodic function and the element's order is selected to reduce motion artifacts resulting from the physiological motion.

13. A method of associating a values of a substantially periodic signal y(t), with the elements of set $G_y$, such that the values have a predetermined relationship to the order of the elements within the set, comprising the steps of:
   (a) acquiring a database of values of the substantially periodic signal y(t);
   (b) evaluating the relative probability of the values of the substantially periodic function y(t) from the samples in the database;
   (c) assigning a value $y(t_i)$ of the substantially periodic signal y(t) to an element $G_y(i)$, by using the evaluated relative probability, so as to maximize the probability that subsequent values of y(t) may be assigned the remaining elements of set $G_y$ according the predetermined relationship;
   (d) freezing the database by ceasing to record values of the substantially periodic signal y(t) subsequent to the time when each element $G_y(i)$ has been associated with a value $y(t_i)$;
   (e) sampling the substantially periodic waveform y(t) to obtain an overscan value $y_s(t_n)$; and
   (f) replacing a previously assigned value $y(t_i)$ with the overscan value $y_s(t_n)$ so that the relationship between the assigned values of the substantially periodic signal y(t) and the elements of set $G_y$ is made closer to the predetermined relationship.

* * * * *